(12) United States Patent
Elston et al.

(10) Patent No.: US 9,274,911 B2
(45) Date of Patent: Mar. 1, 2016

(54) USING SHARED PINS IN A CONCURRENT TEST EXECUTION ENVIRONMENT

(71) Applicant: Advantest Corporation, Tokyo (JP)

(72) Inventors: Mark Elston, Salinas, CA (US);
Harsanjeet Singh, Danville, CA (US);
Ankan Pramanick, San Jose, CA (US);
Leon Lee Chen, San Jose, CA (US);
Hironori Maeda, Gumma (JP);
Chandra Pinjala, San Jose, CA (US);
Ramachandran Krishnaswamy, Cupertino, CA (US)

(73) Assignee: ADVANTEST CORPORATION, Tokyo (JP)

( * ) Notice: Subject to any disclaimer, the term of this patent is extended or adjusted under 35 U.S.C. 154(b) by 263 days.

(21) Appl. No.: 13/773,559

(22) Filed: Feb. 21, 2013

(65) Prior Publication Data

US 2014/0237291 A1    Aug. 21, 2014

(51) Int. Cl.
*G01R 31/319*    (2006.01)
*G01R 31/28*    (2006.01)
*G06F 11/26*    (2006.01)
*G06F 11/263*    (2006.01)

(52) U.S. Cl.
CPC ............ *G06F 11/26* (2013.01); *G01R 31/2834* (2013.01); *G01R 31/31903* (2013.01); *G01R 31/31926* (2013.01); *G06F 11/263* (2013.01); *G01R 31/31907* (2013.01); *G01R 31/31908* (2013.01)

(58) Field of Classification Search
CPC .................. G01R 31/31926; G01R 31/31907; G01R 31/2834; G01R 31/31903; G01R 31/31908

USPC .......................... 714/724, 742, 726, 734, 738
See application file for complete search history.

(56) References Cited

U.S. PATENT DOCUMENTS

| 5,313,387 | A | 5/1994 | McKeeman et al. |
| 5,675,803 | A | 10/1997 | Preisler et al. |
| 6,106,571 | A | 8/2000 | Maxwell |
| 6,807,644 | B2* | 10/2004 | Reis et al. ..................... 714/724 |
| 6,820,219 | B1 | 11/2004 | Huang et al. |
| 6,836,884 | B1 | 12/2004 | Evans et al. |

(Continued)

FOREIGN PATENT DOCUMENTS

| JP | 2003-315414 | 11/2003 |
| JP | 2012-103173 | 5/2012 |

OTHER PUBLICATIONS

Brenner et al., "Concurrent Testing With RF", Adventest Technical Notes 29, Mar. 2010.

*Primary Examiner* — James C Kerveros

(57) ABSTRACT

A method for using shared pins in a concurrent test execution environment is disclosed. The method relates to scheduling tests in concurrently executing test flows for automated test equipment (ATE) in a way so that resources can be shared between the test flows. The method comprises determining if any of a plurality of splits used by a first test contains at least one resource that is shared, wherein the first test and a second test are sequenced for execution in two separate concurrently executing test flows. The method further comprises determining if the first test should execute before the second test if the split is associated with resources required by both the second and first tests. Finally the method comprises reserving the split containing the at least one shared resource for access by the first test before beginning execution of the first test.

23 Claims, 13 Drawing Sheets

(56) References Cited

U.S. PATENT DOCUMENTS

| | | | |
|---|---|---|---|
| 6,966,018 B2 * | 11/2005 | Hilliges | 714/724 |
| 6,990,619 B1 * | 1/2006 | Kapur et al. | 714/729 |
| 7,194,668 B2 * | 3/2007 | Pramanick et al. | 714/724 |
| 7,279,919 B2 | 10/2007 | Volkerink et al. | |
| 7,290,188 B1 * | 10/2007 | Peterson et al. | 714/724 |
| 7,353,427 B2 | 4/2008 | Bates et al. | |
| 7,363,617 B2 | 4/2008 | Barsness et al. | |
| 7,366,967 B2 * | 4/2008 | Jeon et al. | 714/724 |
| 7,367,015 B2 | 4/2008 | Evans et al. | |
| 7,386,777 B2 | 6/2008 | Volkerink et al. | |
| 7,512,858 B2 * | 3/2009 | Rivoir | 714/744 |
| 7,516,441 B2 | 4/2009 | Hamilton et al. | |
| 7,552,370 B2 * | 6/2009 | Pochowski | 714/718 |
| 7,657,805 B2 * | 2/2010 | Ziaja et al. | 714/724 |
| 7,685,487 B1 | 3/2010 | Kuo et al. | |
| 7,743,304 B2 * | 6/2010 | Volkerink et al. | 714/738 |
| 7,809,999 B2 * | 10/2010 | McCandless | 714/724 |
| 7,949,916 B1 * | 5/2011 | Ang | 714/726 |
| 8,010,839 B2 | 8/2011 | Shimura | |
| 2005/0039079 A1 | 2/2005 | Higashi et al. | |
| 2005/0120274 A1 | 6/2005 | Haghighat et al. | |
| 2006/0195747 A1 | 8/2006 | Pramanick et al. | |
| 2007/0245199 A1 * | 10/2007 | Pochowski | 714/742 |
| 2008/0126865 A1 | 5/2008 | Lee | |
| 2008/0295114 A1 | 11/2008 | Argade et al. | |
| 2009/0013224 A1 * | 1/2009 | Ziaja et al. | 714/724 |
| 2009/0204849 A1 | 8/2009 | Shimura | |
| 2009/0316311 A1 | 12/2009 | Hara et al. | |
| 2010/0100786 A1 * | 4/2010 | Dixon et al. | 714/738 |
| 2011/0275170 A1 | 11/2011 | Van Wagenen et al. | |
| 2013/0019228 A1 | 1/2013 | Bates | |

* cited by examiner

Case 1: No shared pin reservation

Case 2: in1, in2, in3 reserved in Y, A & B

Case 3: in1, in2, in3, in4, in5, in6 reserved in Y & A.
in1, in2, in3 reserved in B

USING SHARED PINS IN A CONCURRENT TEST EXECUTION ENVIRONMENT

FIELD OF THE INVENTION

Embodiments of the present invention relate generally to automated device testing and more specifically to the allocation and use of test resources in a concurrent testing environment.

BACKGROUND OF THE INVENTION

Automated test equipment (ATE) can be any testing assembly that performs a test on a device, semiconductor wafer or die, etc. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor. Automatic Test Equipment (ATE) is commonly used within the field of electrical chip manufacturing. ATE systems both reduce the amount of time spent on testing devices to ensure that the device functions as designed and serve as a diagnostic tool to determine the presence of faulty components within a given device before it reaches the consumer.

In testing devices or products, e.g. after production, it is crucial to achieve among others a high product quality, an estimation of the device or product performance, a feedback concerning the manufacturing process and finally a high customer contentment. Usually a plurality of tests is performed in order to ensure the correct function of a device or product. The plurality of tests may be compiled in a test flow wherein the test flow may be separated into different test groups which contain one or more tests for testing the device or product. For example, a semiconductor device may be tested with a test flow comprising contact tests, current-voltage tests, logic tests, speed tests, stress tests and functional tests. A test flow may assume a fixed sequence of test execution. In other words, tests may be performed in a certain temporal order or sequence.

Since testing a semiconductor device or a product, in general, may be quite expensive in terms of capital cost for required test equipment and cost in terms of required test time, testing of a device or product should be performed in an efficient way. Therefore, devices are often tested in parallel to reduce test time. On the other hand, an increased parallel testing often requires a high number of test resources of a test arrangement. The growing number of devices being tested in parallel, and the limited availability of some expensive test equipment resources may become a major cost contributor to, for example, integrated circuit (IC) vendors. The limited availability of certain types of test equipment may be caused by the high capital cost of such test systems or because of the limited availability in terms of the form factor of the test equipment. Test resources which are required for testing a device must either be available per device (with associated high capital costs) or tests requiring these resources are serialized, such that a longer test time may be required and therefore also possibly higher costs as well.

BRIEF SUMMARY OF THE INVENTION

It should be noted that during parallel or concurrent testing each test does not always make use of all the test resources available from a test arrangement. Therefore, certain tester resources allocated to a test may be idle while the test is running even though another concurrently executing test could potentially use that resource while it is idle.

While conventional testing systems may take advantage of some type of limited concurrent testing, they do not take advantage of any synergistic sharing of resources that would minimize the need for additional hardware without sacrificing time and efficiency. Accordingly, the need for sharing of test resources within a concurrent automated testing environment in an efficient and favorable way is desirable. Embodiments of the invention provide solutions to the challenges inherent in the usage of resources in a concurrent test execution environment. According to one embodiment of the present invention, a method for sharing of test resources in a test arrangement where the plurality of cores in a device under test (DUT) are being tested concurrently is disclosed. The described improvements may further relate to a manner in how the individual tests in concurrent test flows for testing DUTs are scheduled to allow resources to be shared optimally between independent cores of a DUT that are being tested at the same time.

In one embodiment, a method for using shared pins in a concurrent test execution environment is disclosed. The method relates to scheduling tests in concurrently executing test flows for automated test equipment in a way so that resources can be shared between the concurrent test flows. The method comprises determining if any of a plurality of splits used by a first test contains at least one resource that is shared, wherein the first test is sequenced for execution in a first test flow branch and wherein a second test is sequenced for execution in a second test flow branch. The first test flow branch executes concurrently with the second test flow branch. The method further comprises determining if the first test should execute before the second test if a split is associated with resources required by both the first and second tests. Finally the method comprises, responsive to a determination that the first test should execute before the second test, reserving the split containing the at least one shared resource for sole access by the first test and executing the first test.

In another embodiment, a computer-readable storage medium having stored thereon, computer executable instructions that, if executed by a computer system cause the computer system to perform a method for scheduling tests using automated test equipment (ATE) is disclosed. The method comprises determining if any of a plurality of splits used by a first test contains at least one resource that is shared, wherein the first test is sequenced for execution in a first test flow branch and wherein a second test is sequenced for execution in a second test flow branch. The first test flow branch executes concurrently with the second test flow branch. The method further comprises determining if the first test should execute before the second test if a split is associated with at least one resource required by both the first and second tests. Finally the method comprises, responsive to a determination that the first test should execute before the second test, reserving the split containing the at least one shared resource for sole access by the first test and executing the first test.

Finally, in another embodiment, a tester system is disclosed. The tester system comprises a system controller for controlling a test plan and coupled to a bus. The system also comprises tester hardware coupled to the bus and operable to test a plurality of devices under test. The system controller communicates to the tester hardware through the bus. Further, the system controller comprises a processor configured to determine if any of a plurality of splits used by a first test is associated with at least one resource that is shared, wherein the first test is sequenced for execution in a first test flow branch and wherein the second test is sequenced for execution in a second test flow branch. The first test flow branch is operable to execute concurrently with the second test flow branch. The processor is further configured to determine if the first test should execute before the second test if a split contains resources required by both the first and second tests. Finally, the processor is configured to reserve the split containing the at least one shared resource for sole access by the first test before beginning execution of the first test, wherein no other test is allowed access to the split while it is reserved if it is determined that the first test should execute first.

The following detailed description together with the accompanying drawings will provide a better understanding of the nature and advantages of the present invention.

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
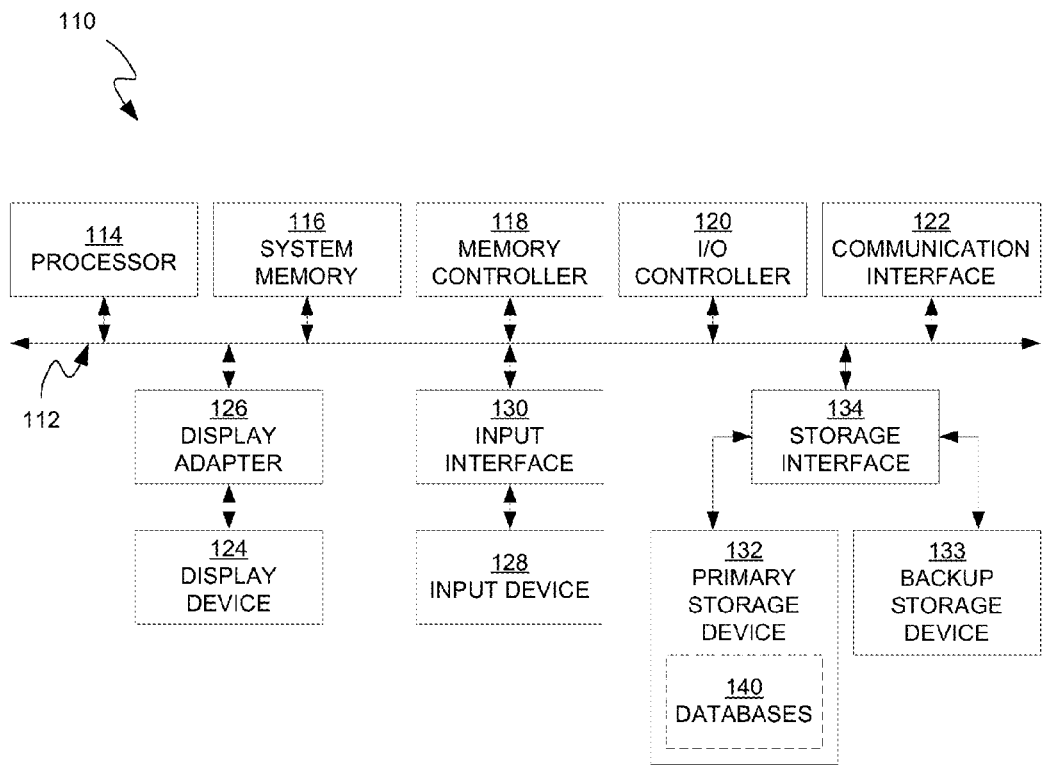
FIG. 1 is a computer system on which embodiments of the automated test system of the present invention can be implemented in accordance with one embodiment of the present invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "allocating," "associating," "executing," "removing," "releasing," "reserving," "moving," "copying," "setting," "accessing," "freeing," "controlling," "adding," "determining," "identifying" or the like, refer to actions and processes (e.g., flowchart 800 of FIG. 8) of a computer system or similar electronic computing device or processor (e.g., system 110 of FIG. 1). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1 is a block diagram of an example of a computing system 110 capable of implementing embodiments of the present disclosure. For example, computing system 110, in one embodiment, could implement the controller of the tester system. Computing system 110 broadly represents any single or multi-processor computing device or system capable of executing computer-readable instructions. Examples of computing system 110 include, without limitation, workstations, laptops, client-side terminals, servers, distributed computing systems, or any other computing system or device. In its most basic configuration, computing system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 1, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 1, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 1, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 1, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 1 need not be present to practice the embodiments described herein. The devices and subsystems referenced above may also be interconnected in different ways from that shown in FIG. 1. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

For example, a computer program for running test plans may be stored on the computer-readable medium and then stored in system memory 116 and/or various portions of storage devices 132 and 133. When executed by the processor 114, the computer program may cause the processor 114 to perform and/or be a means for performing the functions required for sharing resources between multiple test cores in a concurrent test environment.

Using Shared Pins in a Concurrent Test Execution Environment

Conventional methods of parallel or concurrent testing do not always make optimal use of all the tester resources available from a test arrangement. Therefore, certain tester resources allocated to a test may be idle while the test is running even though another concurrently executing test could potentially use that resource while it is idle.

For example, a plurality of devices under test (DUTs) may be tested using a predetermined test flow. Each of the DUTs is divided into cores. Because the DUTs are divided into separate intellectual property (IP) cores (or custom circuits), the tests run as part of the test flow for each of the cores can usually be executed independently of other cores. Users are therefore able to write test plans for each core separately, identify the test plans as concurrent and run the tests at the same time. Under conventional methods of testing, all tester resources for each branch of the concurrent test needed to be unique and could not overlap with resources being used by a different core in another branch. In fact, validation procedures for the test plans run in conventional concurrent testing systems would not validate a test plan if there were any common resources allocated between two branches of a concurrent test. Conventional methods of concurrent testing, therefore, were not able to allocate resources optimally between two concurrent branches of a test flow.

Embodiments of this present invention provide solutions to the increasing challenges inherent in the optimal scheduling of testing resources within a test arrangement when executing a plurality of tests concurrently. More specifically, embodiments of the present invention allow for sharing of test resources in a concurrent test environment for automated testing systems. According to one embodiment of the present invention, a method for sharing of test resources in a test arrangement where the plurality of cores in a DUT are being tested concurrently is disclosed. As described herein, various embodiments of the present disclosure provide test time reductions, as well as test resource reductions and/or testing resource optimization. Therefore, testing may be optimized and made more efficient compared to conventional test approaches.

Figure 2A:
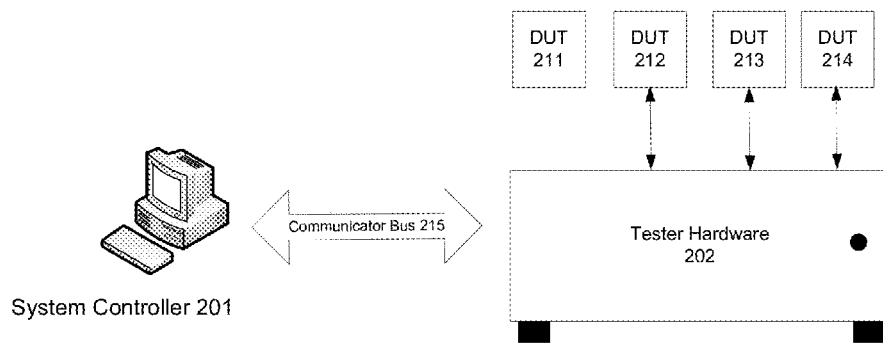
FIG. 2A is a schematic block diagram for an automated test equipment apparatus on which embodiments of the present invention can be implemented in accordance with one embodiment of the present invention.

FIG. 2 is a schematic block diagram for an automated test equipment (ATE) apparatus on which embodiments of the concurrent test system can be implemented in accordance with one embodiment of the present invention. In one embodiment, the system controller 201 comprises one or more linked computers. For example, testing systems such as Advantest Corporation's T2000 tester family, use a network of computers. In other embodiments, the system controller often comprises only a single computer. The system controller 201 is the overall system control unit, and runs the software for the ATE that is responsible for accomplishing all the user-level testing tasks, including running the user's main test program.

The communicator bus 215 provides a high-speed electronic communication channel between the system controller and the tester hardware. The communicator bus can also be referred to as a backplane, a module connection enabler, or system bus. Physically, communicator bus 215 is a fast, high-bandwidth duplex connection bus that can be electrical, optical, etc. System controller 201 sets up the conditions for testing the DUTs 211-214 by programming the tester hardware through commands sent over the communicator bus 215.

Tester hardware 202 comprises the complex set of electronic and electrical parts and connectors necessary to provide the test stimulus to the devices under test (DUTs) 211-214 and measure the response of the DUTs to the stimulus, and compare it against the expected response.

A test program or test plan comprises all user-defined data and control flows that are necessary to perform a semiconductor device test on an ATE system. It typically runs on the system controller 201. The main control flow in a test program, which dictates the sequence of individual tests to be applied to the DUTs, and the order in which the tests will be applied (which is dependent on the results of individual tests), is referred to as the test program flow.

Figure 2B:
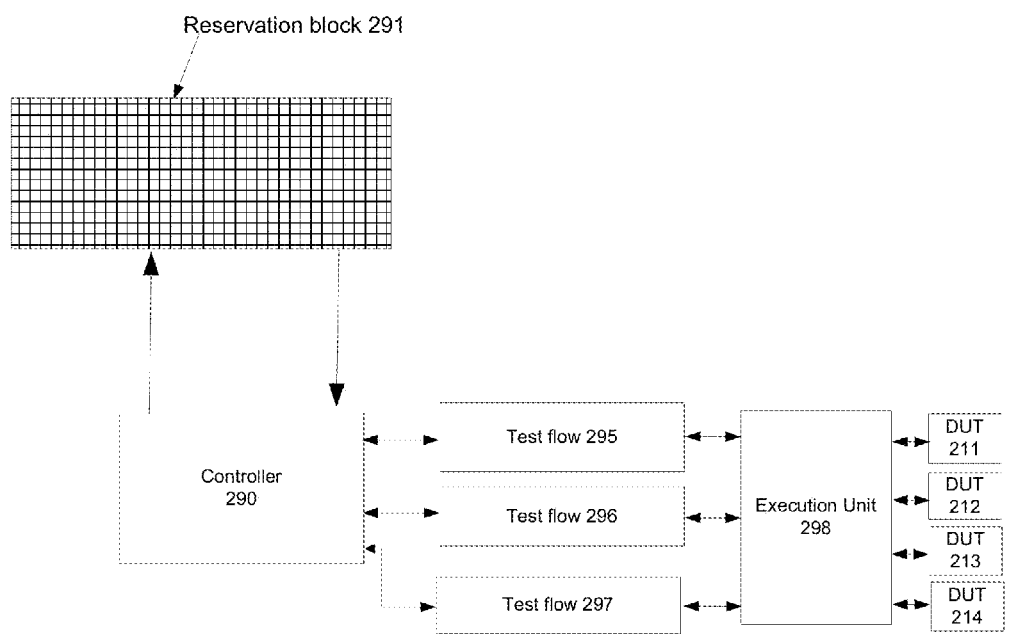
FIG. 2B is a schematic block diagram of an exemplary software representation for the automated test system in accordance with one embodiment of the present invention.

FIG. 2B is a schematic block diagram of an exemplary software representation for the automated test system in accordance with one embodiment of the present invention. In one embodiment, in a typical testing scenario, the user's test plan, runs on controller module 290 which is implemented in software on system controller 201. Controller module 290 uses the test plan to set up the various test flows for the test, e.g., test flow 295, test flow 296 and test flow 297. The test plan then executes the user's test program flow on DUTS 211, 212, 213 and 214 using execution unit 298. The results of the test program flow are communicated back to the controller module 290 and, hence, to the user in accordance with the software running on the controller 290. Based on these results, the software running on the controller module 290 decides whether the DUTs have passed or failed the tests in the flow, how they should be graded and binned, when to progress to the next lot of DUTs, etc. Further, controller module 290 is also communicatively coupled with reservation block 291, which keeps track of all the shared resources in the system.

Figure 3:
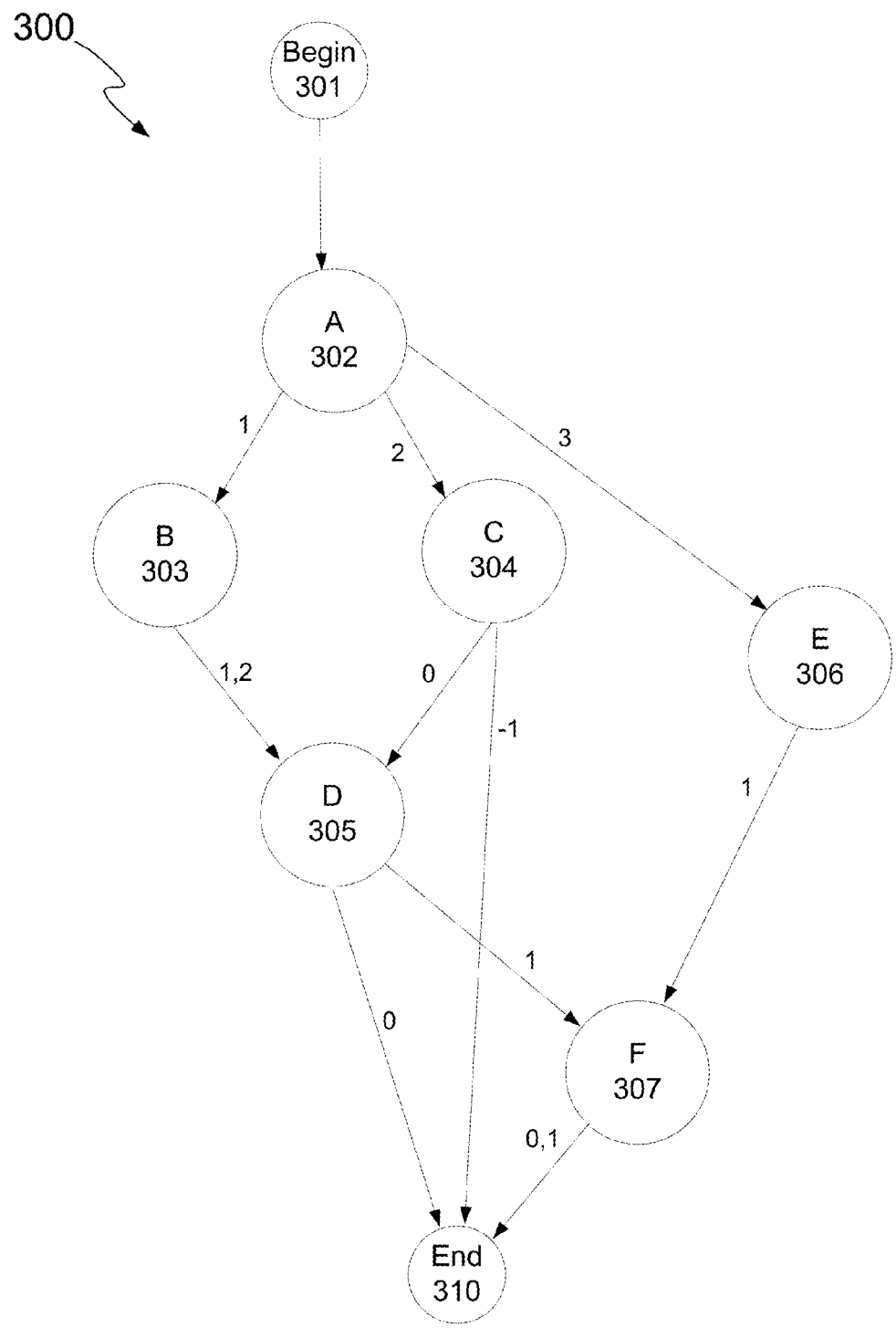
FIG. 3 is a block diagram of an exemplary conventional test flow.

FIG. 3 is a block diagram of an exemplary conventional test flow 300. The test program flow is a critical element of the user's test plan and the vehicle through which user-defined tests are executed in an ATE system. A test flow, such as test flow 300, is a directed graph, in which each vertex A, B, C, D, E and F, 302-307, represents a flow item, which encapsulates the test or the sub-flow to be executed. The begin vertex 301 and the end vertex 310 are the entry point for the flow execution and the exit point for the flow execution respectively. These two special vertices are not flow items, but represent important singularities through which all DUTs being tested by that flow have to pass.

Each directed edge (or arrow) represents the transition the flow execution has to make from a source flow item to a destination flow item, based on the value of the return result from the execution of the source flow item's test. The user programs the transitions of the flow execution. Further, most test flow graphs are weakly connected, i.e., there are no vertices in it that are isolated and cannot be reached from any other vertex by replacing the directed edges with undirected edges.

The label on each edge represents the return result from the test (the source vertex for that directed edge) that will cause the flow execution to make a transition to the next test (the destination vertex for that edge). Thus, for example, after execution of test A, if the return status were "1", the DUT would next be tested with test B, if it were "2", test C, and if it were "3", with test E. Similarly, an execution result of either "1" or "2" for test B would both result in test D being executed next. A result of "−1" on executing test C might constitute a rejection of the DUT, leading to a transition directly to the end of the flow for the rejected DUT. Similarly, a result of "0" on executing test F might also constitute a rejection of the DUT, leading again to a transition directly to the end of the flow for the rejected DUT, while a result of "1" on executing F, while not indicating a rejection, also leads to a transition to the end, simply because there are no more tests left to run.

Figure 4A:
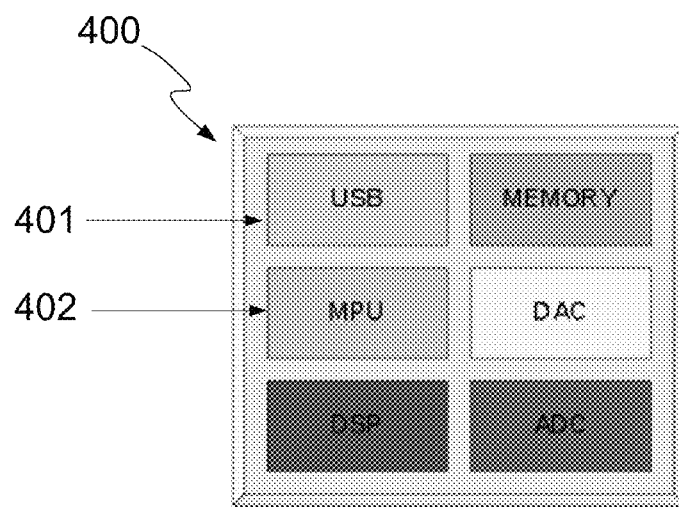
FIG. 4A is a block diagram of an exemplary system on a chip (SoC) device composition.

Concurrent testing is a well-known technique conventional systems use to reduce test time for system on chip (SoC) devices. Recent SoC devices are becoming a conglomerate of various intellectual property (IP) blocks (or cores) and custom circuits as the semiconductor integration technology evolves. FIG. 4A is a block diagram 400 of a typical SoC device composition with IP cores for the memory, the digital signal processor (DSP), the digital to analog converter (DAC), the analog to digital converter (ADC), the universal serial bus (USB) and the microprocessor unit (MPU).

Concurrent test execution is made possible by the fact that each DUT is broken up into separate IP cores. Each core can typically execute independently of other cores and can therefore lend itself to be tested independently of other cores as well. Users are allowed to write test plans for each core, identify the test plans as concurrent and run tests on the on the cores at the same time thereby increasing test efficiency.

Figure 4B:
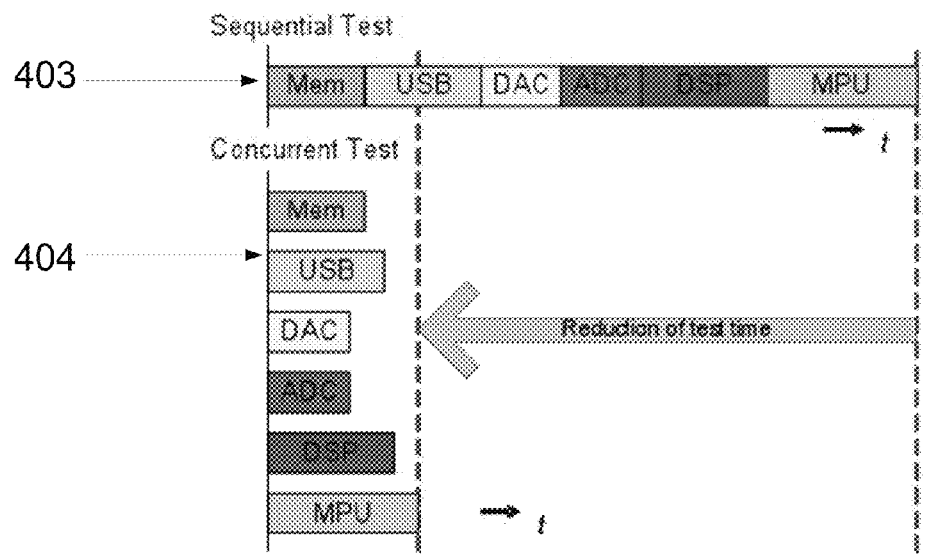
FIG. 4B is a block diagram comparing exemplary typical test times in concurrent systems versus sequential systems.

Without some form of concurrent testing, the testing of each IP core, for example IP cores 401 and 402, must be done sequentially. Concurrent testing enables those tests to be executed in parallel to reduce test time as illustrated in FIG. 4B. FIG. 4B is a block diagram comparing hypothetical test times in concurrent systems versus sequential systems. Sequential test 403, as seen in FIG. 4B, takes longer because each of the cores from FIG. 4A are tested in sequence. By comparison, in concurrent test 404, the cores from FIG. 4A are tested concurrently and the total execution time is much shorter. Therefore, concurrent testing is an approach that can be applied for testing IP specific characteristics and functionality when the IPs in a DUT can function independently.

Figure 5A:
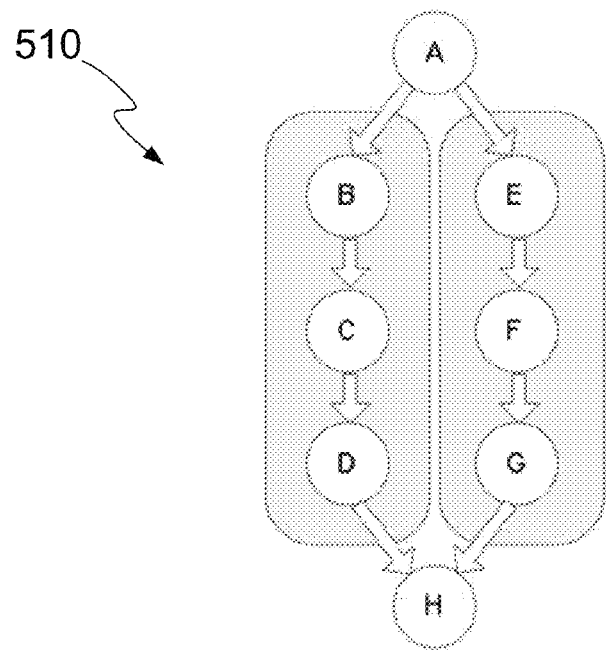
FIGS. 5A and 5B are block diagrams of two exemplary concurrent test flows.
Figure 5B:
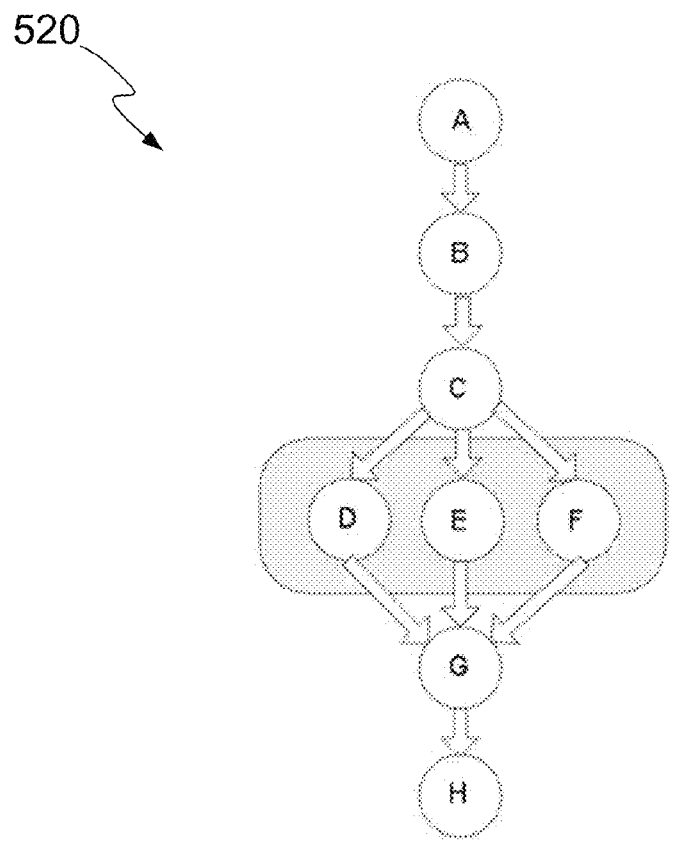

FIGS. 5A and 5B are block diagrams of two exemplary concurrent test flows, 510 and 520. Test flow 510 comprises two test flows each containing three tests. The "BCD" test flow and the "EFG" test flows are started concurrently after the completion of test "A". After execution of both flows completes, the main flow continues with test "H". FIG. 5B is an example of three tests running concurrently. Test flow 520 branches out into tests "D", "E" and "F", where each of the three tests are run concurrently. In one embodiment, each individual test must be enclosed in its own flow and the three test flows would be executed concurrently.

The problem with conventional systems that performed concurrent testing was that because each of the cores in the device needed to function and be tested independently, the user was required to isolate resources used in each of those tests. In other words, the system controller 201 could not allocate any resources to be shared among those tests. Accordingly, the sets of resources used in each concurrent flow of execution were required to be mutually exclusive. That is, no resource could be accessed by more than one concurrently executing flow. In fact, in conventional systems, a validation test was run to ensure that no two branches of a concurrent test use the same resources. For example, if the user wrote a test plan in a conventional system that shared pins between two IP cores, a resource exception error would result that alerted the user that multiple pins could not be used concurrently. In other words, all test resources for each branch of a concurrent test flow, as shown in FIGS. 5A and 5B, needed to be unique and could not overlap with resources being used by a different core in another branch.

The present invention provides embodiments for sharing resources in a concurrent test environment. In one embodiment of the present invention, the user can write test plans that share resources e.g. stimulus pins, measurements pins, power supply pins, or any other pins within tester hardware 202 between two or more branches of a test flow that are being concurrently executed. The term "pin" is being used to generically describe the signal-carrying conductive members (i.e., leads or pads) of the integrated circuit, irrespective of whether each member physically resembles a pin, or instead, takes the form of a metalized pad.

In one embodiment, the user can write a test plan that will allow the user to designate certain pins in the in tester hardware 202 as "shared" between two or more IP cores. By designating the pin as a shared resource, the user prevents the test plan from being invalidated during the validation process for the test plan. The resource validation part of the validation process can be modified to not include the designated shared pins when ascertaining that the pins on concurrent branches are disjoint. Accordingly, during the validation process, all resources identified as shared are exempted from validation.

During execution, however, the tester will optimize the use of these resources by scheduling them sequentially or serially as needed within the concurrent test flow in a way such that throughput is maximized. The tester software on system controller 201 will schedule the tests in a way so as to avoid resource conflicts between concurrently executing flows of execution. If the IP cores can be tested simultaneously in such a way that the shared pins are not used at the same time, then parallel testing of the cores is allowed.

Nevertheless, if there is a circumstance in which there is a resource conflict so that certain shared pins would be used at the same time, then there is a need for arbitration of the execution of these branches. In this case, the execution of any tests that use the shared pins needs to be serialized, so that the shared pin is in use by a given test within only one of the concurrent branches at any given time. Thus, even with sharing of resources there is a certain degree of serialization that typically needs to be done because a pin cannot be physically used by two tests at the same time.

The tester operating system will typically transparently handle any resource conflicts and any resulting serializing of tests that may need to performed, so that the user does not need to plan for any such contingencies when preparing the test plan or test classes. Accordingly, the test classes, which are usually developed in a programming language such as C++, do not need to be customized to handle shared resources. Users can write the test classes and test plan without taking into account specifics related to resource conflicts between shared resources. The tester operating system resolves any resource conflict and prevents deadlock by enforcing an order for resource assignment.

In a typical embodiment, the tester operating system running on system controller 201 will act as a centralized "gatekeeper" that arbitrates between the various flow items (or tests) requesting shared resources e.g. pins and will synchronize and schedule access based on user programmed criteria. In this embodiment, the individual flow items will not reserve resources on their own accord. Instead, the flow items declare what resources they need to the tester operating system and the tester operating system will allocate resources accordingly. In this case, the tester operating system assigns locks to any test (or "reserves" any test) that is using a shared resource. While a test is reserved, only that test (or flow item) can use that shared resource while the other tests have to wait for the resource to free up. The tester operating system is responsible for assigning the locks and the individual tests do not arbitrate the assignment of locks between each other.

In another embodiment, a pin reservation system is implemented such that each flow item in a concurrent branch of a test flow can be operable to reserve shared pins using a token system. Instead of using a central gatekeeper, the various flow items will share resources between each other using tokens. While any one node (or flow item) of a test in a test flow has reserved a token for a pin for the pin, no other node in any other branch of the test flow is allowed to contemporaneously have access to the same pin. The pin reservation system prevents shared pins from being used simultaneously in concurrent testing.

In one embodiment, the way branches are executed in the tester software can be modified so that at no point in time will multiple tests that use "splits" containing common shared pins ever execute simultaneously. A "split" is the smallest hardware unit (e.g., set of pins) that can be assigned to, and controlled by, the system controller 201. Splits are typically groups of pins that have to be handled as a unit due to hardware constraints. In one embodiment, however, splits can be groups of any resources that can be shared between test flow items. While splits may be assigned to different values (e.g., voltage, current, etc.) independently of each other, they can only be used by a single system controller 201 at a time. Similarly, the splits need to be assigned to individual threads of execution during the test plan execution as well. Accordingly, all the device pins in the same split as a shared pin are designated as servicing the same flow item in a branch of a test flow. This is similar to how a single shared pin needs to be reserved by one flow item during concurrent testing. Stated differently, all the unshared pins in a split also need to be reserved by the same flow item when reserving even one shared pin in a split. The split, therefore, needs to be reserved as a whole.

In one embodiment, the resource validation process can be modified so that it ignores any split that contains a shared pin during the validation process. In other words, the validation process will not use splits containing a shared pin when attempting to validate disjointness of concurrent branches.

In one embodiment, the user may need to allow the concurrent execution of certain test flows which use shared pins without serializing them. This may be required, for instance, for pins, which are used by the flow item but will not be modified during the execution. In this case, during the preparation of the test plan, the user would need to specify this override so that the designated shared pins are allowed to execute in parallel.

FIGS. 6A-D are a series of flow diagrams of exemplary concurrent test flows illustrating how the execution of tests within the test flows is scheduled when tests use splits containing common shared pins in accordance with one embodiment of the invention.

As discussed above, in one embodiment, the execution of branches of concurrent flow items is scheduled by the system controller 201 so that at no point in time will multiple tests (or flow items) that use splits containing common shared pins ever execute simultaneously. In another embodiment, this will be true even if a test in one concurrent branch only uses non-shared pins from a given split and a test in another concurrent branch uses only a single shared pin from the same split. In cases where multiple tests use splits containing common shared pins, then the execution of such tests is serialized.

Figure 6A:
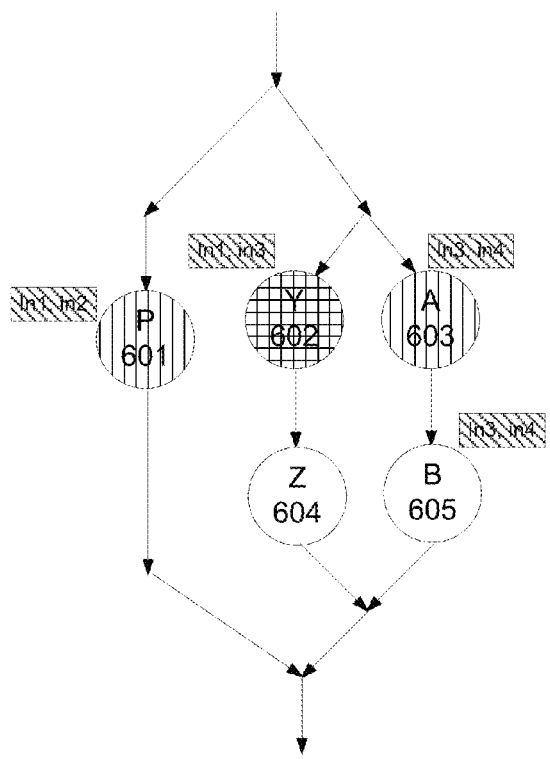
FIGS. 6A, 6B, 6C and 6D are a series of flow diagrams of exemplary concurrent test flows illustrating how the execution of tests within the test flows is scheduled when tests use splits containing common shared pins in accordance with one embodiment of the invention.
Figure 6A:
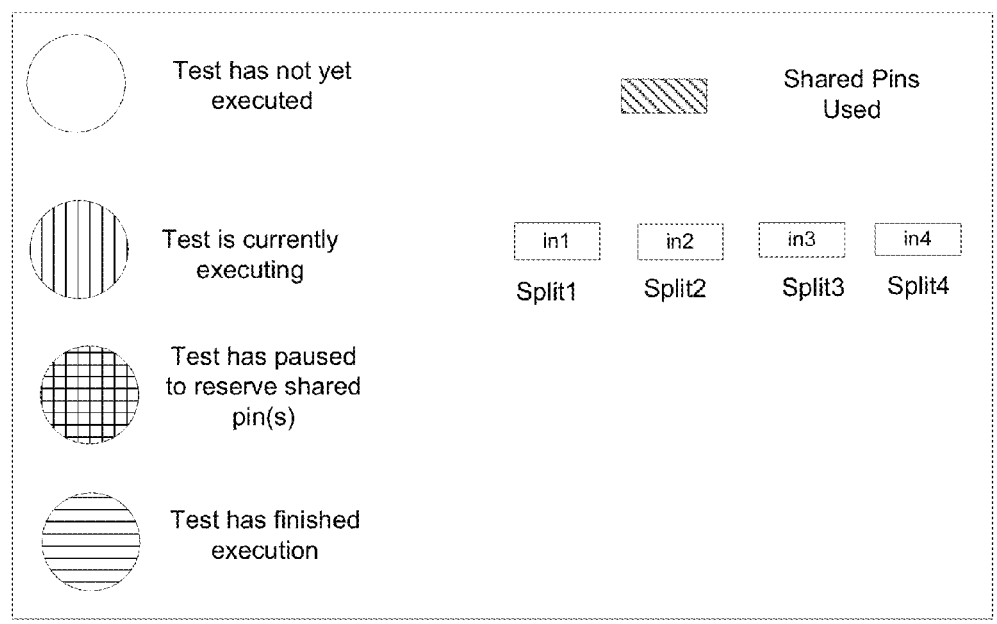

In FIG. 6A, for example, flow items P 601 and Y 602 use a split, Split1, containing a shared pin, in1. P 601 starts executing while Y 601 will wait. Also A 603 will execute concurrently with P 601 because it does not have any common splits that are being used in other test flow branches and, thus, A 603 can be allowed to execute concurrently.

In one embodiment, the tester operating system will not reserve a partial set of splits requested by a flow item if it is unable to reserve the complete set of splits required for that flow item. For example, in FIG. 6A, test flow item P 601 is executing using Split1 and Split2 containing shared pins, in1 and in2 respectively. Test flow item Y 602 needs Split1 and Split3 containing shared pins in1 and in3, but it does not reserve Split3 even though it is available as Split1 was unavailable. This allows test flow item A 603, which requires Split3 and Split4, to proceed to execute.

Figure 6B:
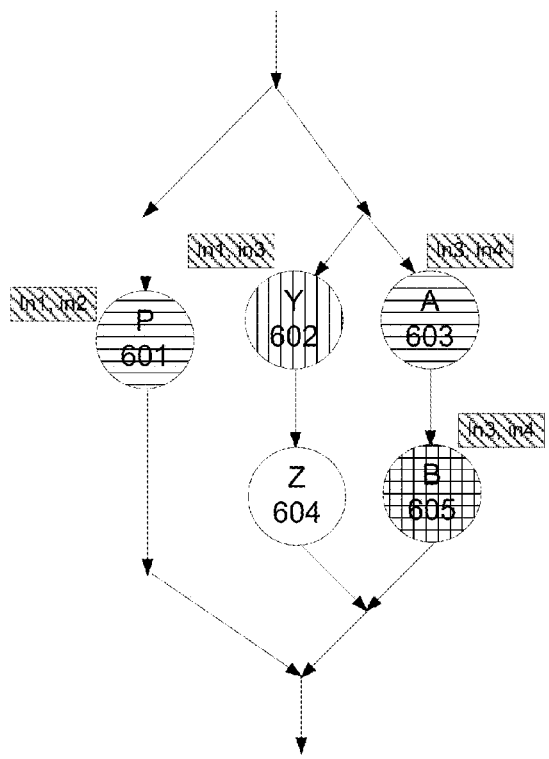
Figure 6B:
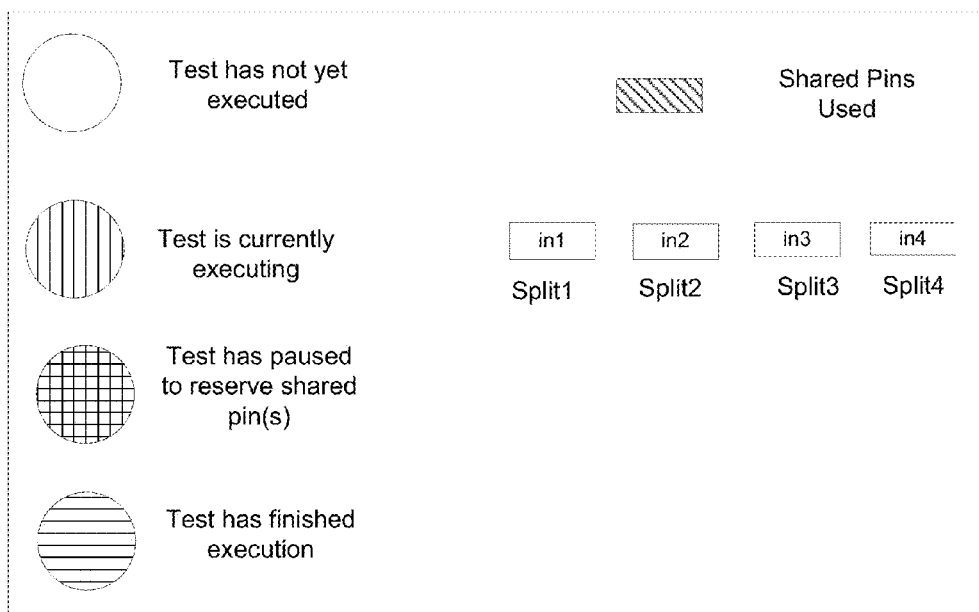

FIG. 6B is a continuation of the flow diagram from FIG. 6A. As FIG. 6B indicates, as the tests in flow item P 601 complete, the paused test in flow item Y 602 starts executing. In addition, flow item A 603 has also completed its test. However, flow item B 605 has to pause because it uses a split, Split3, derived from the usage of shared pin, in3, which is currently being used by Y 602.

Figure 6C:
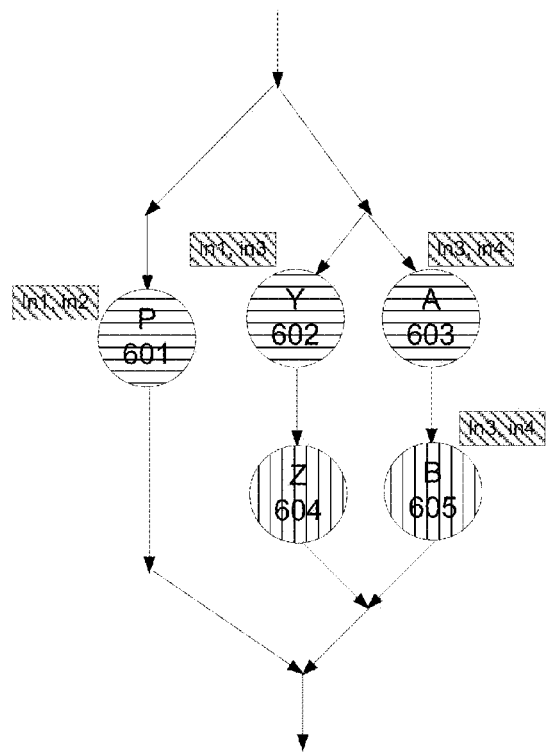
Figure 6C:
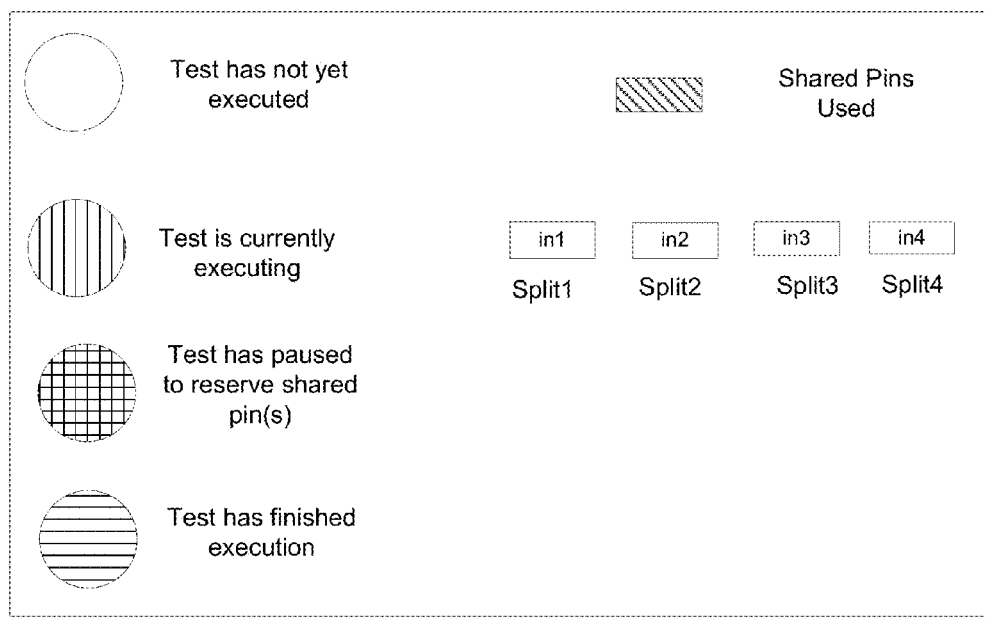

FIG. 6C is a continuation of the flow diagram from FIG. 6B. As FIG. 6C indicates, the tests in flow item Y 602 completes execution and flow item Z 604 starts executing right away as it does not contain any splits with shared pins and, therefore, does not need to reserve any splits. In addition, as B 605 can now reserve Split3 because Y 602 has finished executing, it also starts executing concurrently with Z 604.

Figure 6D:
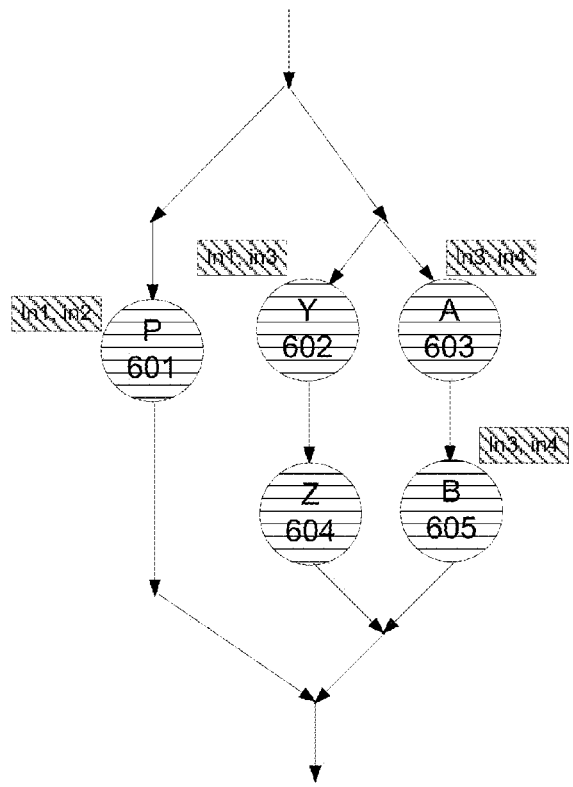
Figure 6D:
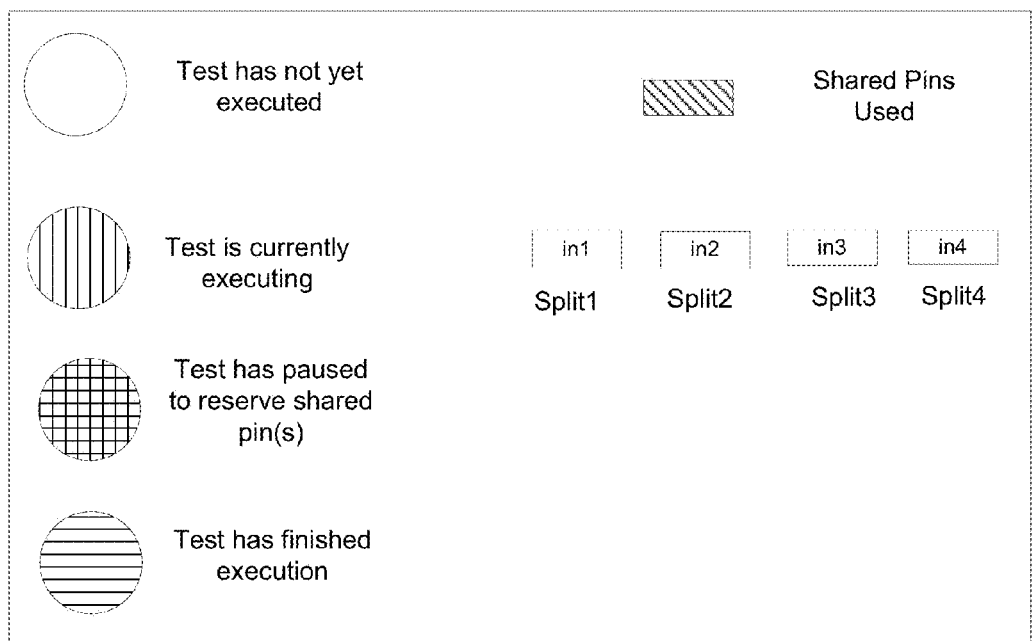

FIG. 6D is a continuation of the flow diagram from FIG. 6C. Both Z 604 and B 605 finish executing and the execution of the concurrent test flow item reaches completion.

Figure 7A:
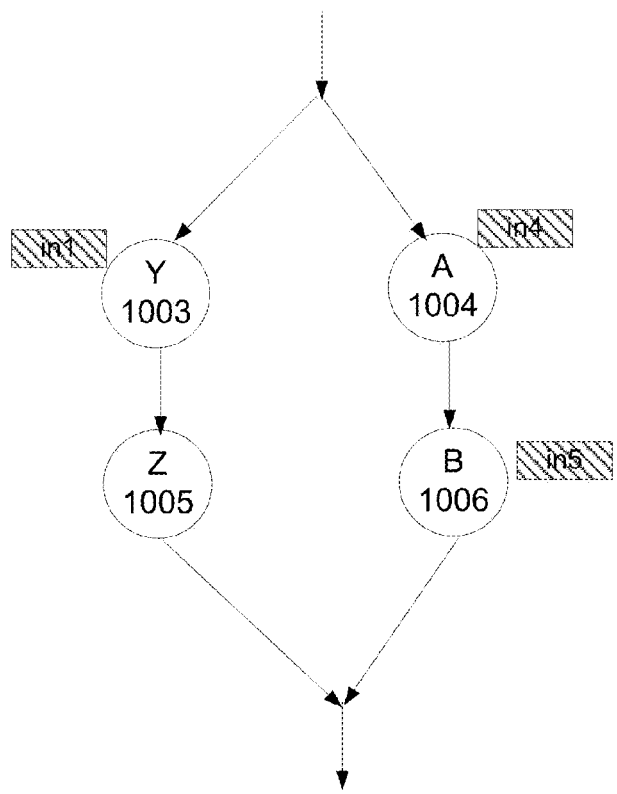
FIGS. 7A, 7B and 7C are flow diagrams of exemplary concurrent test flows illustrating how test execution is serialized when tests use common splits that contain shared pins, which are also being used in concurrent branches.
Figure 7A:
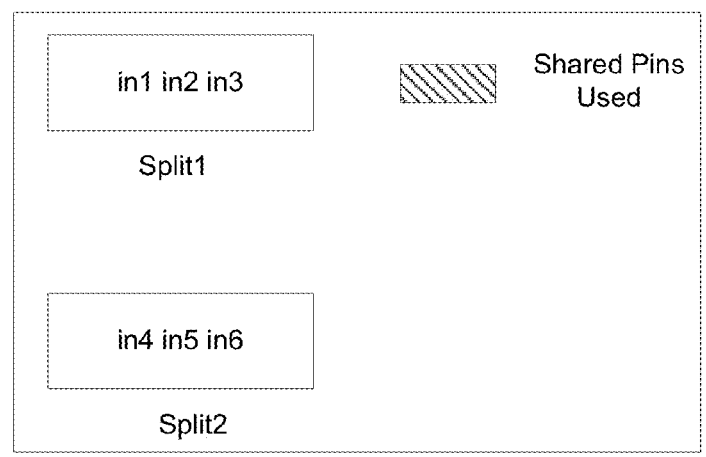
Figure 7B:
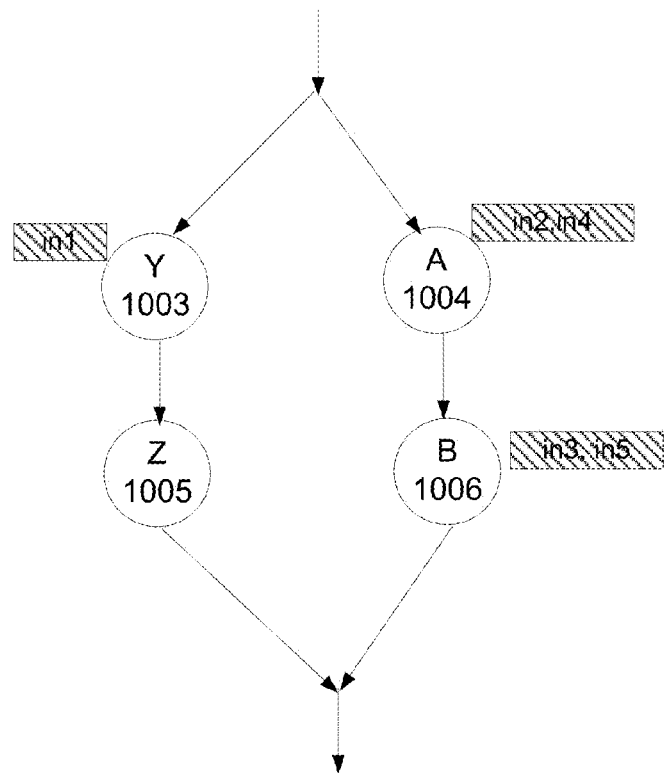
Figure 7B:
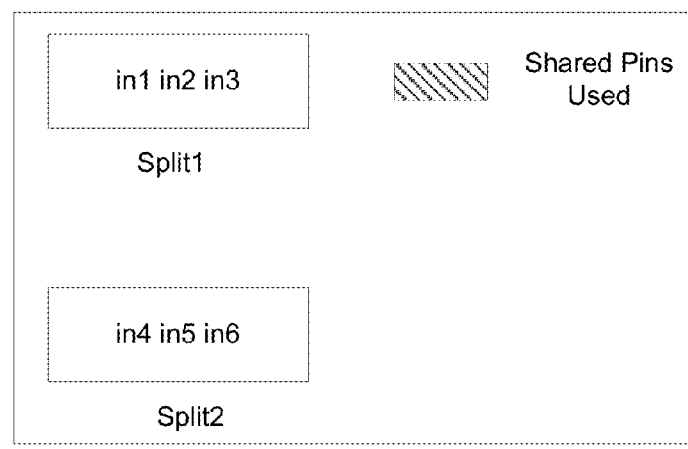
Figure 7C:
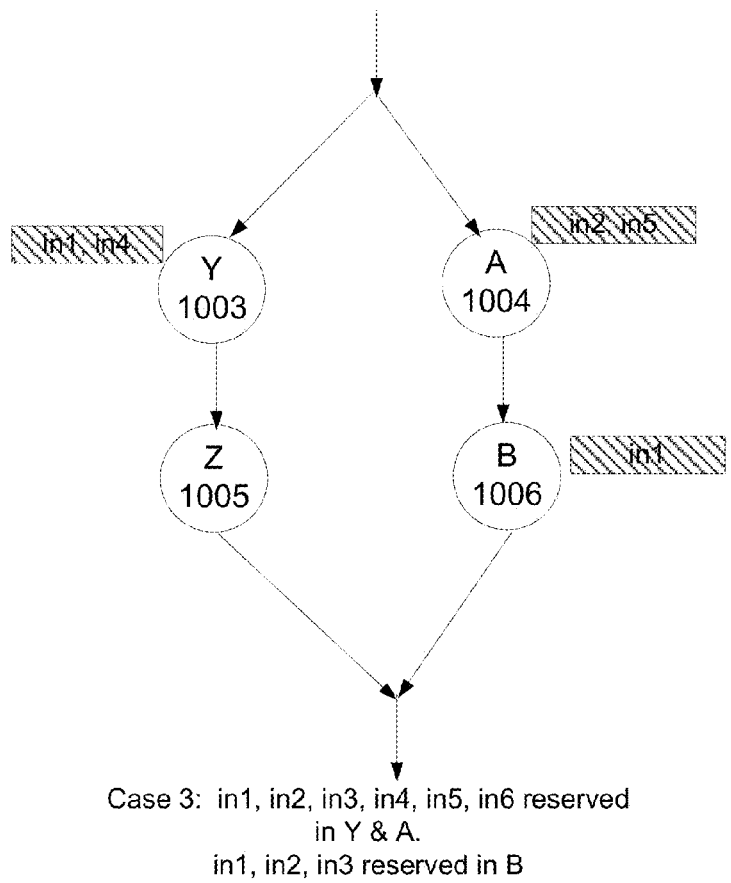
Figure 7C:
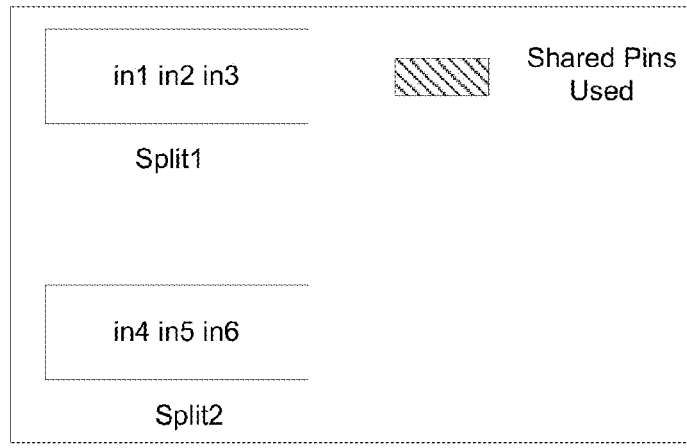

FIGS. 7A-C are a series of flow diagrams of exemplary concurrent test flows illustrating how test execution is serialized when tests use common splits that contain shared pins, which are also used in concurrent branches.

In one embodiment, the concurrent flow execution engine in the tester operating system will serialize the execution of tests using common splits that contain shared pins and are used in concurrent branches. However, multiple tests using disjoint sets of splits that contain shared pins will not be serialized, but will be allowed to execute in parallel. Stated differently, splits that do not contain any resources (or pins) in common can be used by tests executing in parallel. Also, similar to the flow in FIGS. 6A-6D, if a split contains non-shared pins in addition to shared pins, and any of the non-shared pins are being used in multiple concurrent branches, all the pins that belong to the split will be reserved during execution of the other concurrent branches. This effectively results in serialized execution of the tests.

FIG. 7A is the first in a series of test flow snapshots comprising flow items Y 1003, A 1004, Z 1005 and B 1006. FIG. 7A illustrates a case with no shared pin reservation. No pins from the same split are used by multiple branches and thus no reservations will be done. Both Y 1003 and A 1004 can execute concurrently because they do not use any pins from the same split. After A 1004 finishes executing, B 1006 can reserve Split2 and commence execution. Because Z 1005 does not use any pins from either Split1 or Split2, no reservations need to be done and test flow Z 1005 will execute after Y 1003 completes.

FIG. 7B is the second in the series of test flow snapshots comprising flow items Y 1003, A 1004, Z 1005 and B 1006. In FIG. 7B, pins from Split1 are used in both branches. Y 1003 uses Split1 while A 1004 uses both Split1 and Split2. Split1 will therefore be reserved prior to the execution of Y 1003. Both Split1 and Split2 will be reserved prior to the execution of A 1004. The tester operating system will determine which one of Y 1003 or A 1004 to execute first and enforce the order. Subsequently, both Split1 and Split2 will be reserved prior to the execution of B 1006. No reservation needs to be done before execution of Z 1005 as discussed above.

FIG. 7C is the third in the series of test flow snapshots comprising flow items Y 1003, A 1004, Z 1005 and B 1006. In FIG. 7C, both Y 1003 and A 1004 use pins from both Split1 and Split2 and thus all the pins in Split1 and Split2 are reserved prior to the execution of these tests. Again, the tester operating system will determine which one of Y 1003 or A 1004 to execute first. Both Split1 and Split2 need to be reserved by the flow item that is executing first to prevent deadlock. For example, if Y 1003 were to reserve Split1 and A 1004 were to reserve Split2, a deadlock condition would result if after executing part of the test, the two flow items needed to trade splits between each other.

Finally, because B only uses pins from Split1, only in1, in2 and in3 are reserved prior to the execution of B. Similar to above, no reservation needs to be done before execution of Z 1005 as discussed above.

Figure 8:
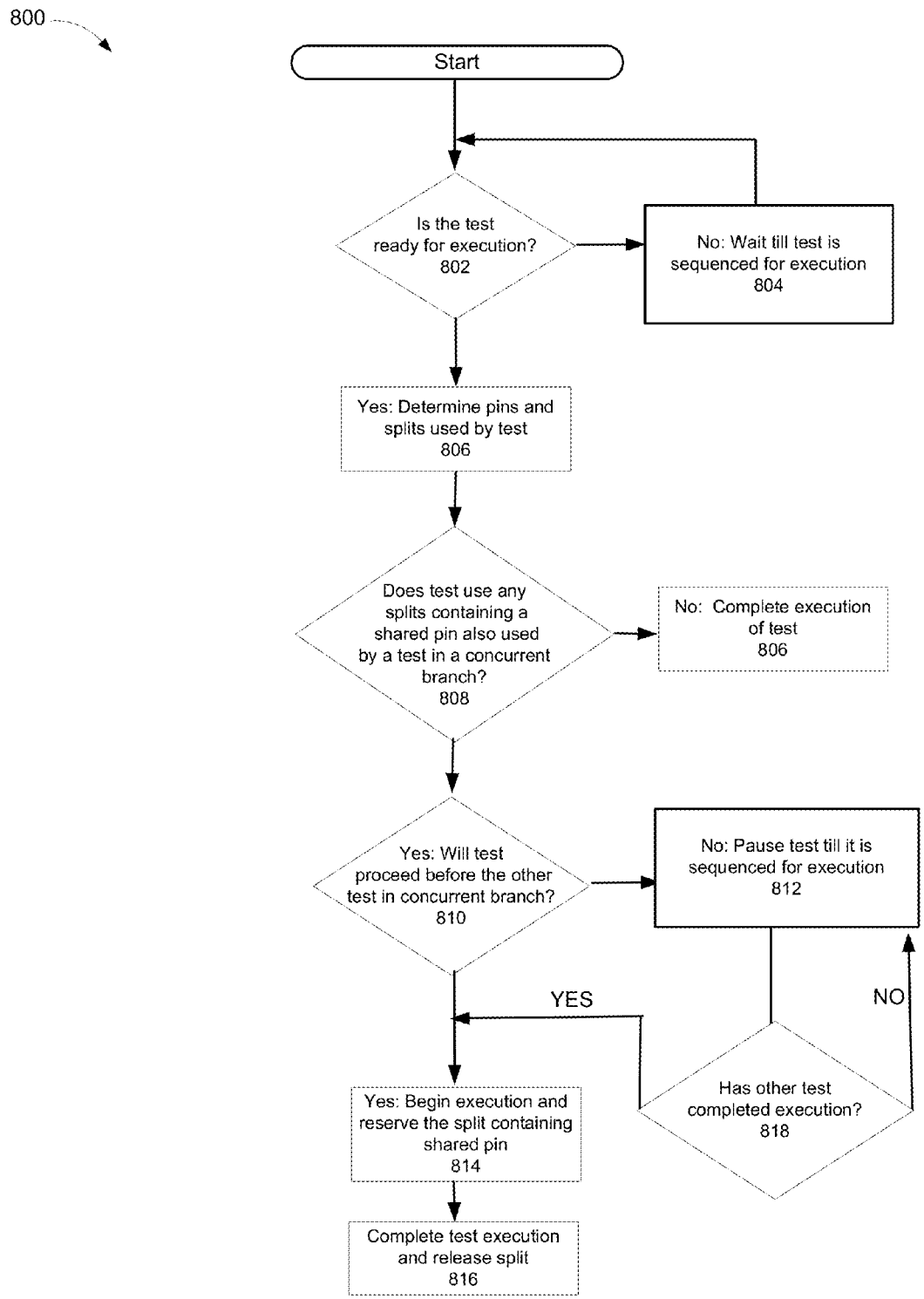
FIG. 8 depicts a flowchart of an exemplary computer controlled process of scheduling tests when resources are shared between concurrently executing test flows in accordance with one embodiment of the present invention.

FIG. 8 depicts a flowchart of an exemplary computer implemented process of scheduling tests when resources are shared between concurrently executing test flows in accordance with one embodiment of the present invention. The invention, however, is not limited to the description provided by flowchart 800. Rather, it will be apparent to persons skilled in the relevant art(s) from the teachings provided herein that other functional flows are within the scope and spirit of the present invention. Flowchart 800 will be described with continued reference to exemplary embodiments described above, though the method is not limited to those embodiments.

When scheduling tests for execution, in one embodiment, at step 802, the tester operating system on system controller 201 will determine, for each test (or flow item), if the test is scheduled for execution. If the test is not scheduled for execution, then in accordance with block 804, the tester operating system will wait to execute the test.

If the test is sequenced for execution, then at execution time, as indicated by block 806, the tester operating system will check to determine the splits and pins that the test will use. If at step 808 the operating system determines that the test uses a split that contains a pin that is a designated shared pin being used by another test in a concurrent branch, then at step 810, the tester operating system will determine if the test should reserve the split or if it should pause while the test in the concurrent branch using the shared pin runs to completion. If, however, the test does not use a split that contains any shared pins, then at step 806 it is allowed to execute.

At step 810, if the tester operating system determines that the test in the concurrent branch should proceed first, then the test is paused at step 812 till the other test in the concurrent branch completes execution and releases the split. The determination as to which of the tests should proceed first is based on criteria specified by the user in the test plan and implemented by the tester operating system. At step 818, a check is performed to see if the other test in the concurrent branch has reached completion. If not, the test continues to remain in its paused state at step 812. If it has finished, the test is allowed to proceed to step 814.

At step 814, the test begins executing and is allowed to reserve the split while it is executing. While the test has reserved the split any other test in concurrent branches that may use a shared pin from the same split will need to pause to wait for the test to release the split. Finally at step 816, execution is completed and the split is released for use to other tests waiting to access the split.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for scheduling tests using automated test equipment (ATE), said method comprising:
   determining if any of a plurality of splits used by a first test contains at least one shared resource, wherein the first test is sequenced for execution in a first test flow branch and wherein a second test is sequenced for execution in a second test flow branch, wherein the first test flow branch is operable to execute concurrently with the second test flow branch;
   determining if the first test should execute before the second test if the split containing the at least one shared resource is associated with resources required by both the first test and the second test; and
   responsive to a determination that the first test should execute before the second test, reserving the split containing the at least one shared resource for sole access by the first test and executing the first test.

2. The method of claim 1, further comprising completing execution of the first test and releasing the split to other tests.

3. The method of claim 1, further comprising, responsive to a determination that the second test should execute before the first test, pausing the first test to wait for the split while the second test has the split reserved.

4. The method of claim 1, further comprising executing the second test simultaneously with the first test if it is determined that splits used by the first test contain no resources that are required by the second test.

5. The method of claim 1, wherein the shared resource is an Input/Output (I/O) pin.

6. The method of claim 5, wherein the I/O pin is selected from a group comprising: stimulus pin, measurements pin, and power supply pin.

7. The method of claim 1, wherein the shared resource is operable to be designated as a shared resource before a resource validation process.

8. The method of claim 7, wherein a designated shared resource is ignored during the resource validation process when ascertaining that the resources used on the first test flow branch and the second test flow branch are disjoint.

9. The method of claim 1, wherein the first test relates to a first core of a device under test (DUT) and wherein the second test relates to a second core of the DUT, wherein the first core of the DUT performs a function different from the second core of the DUT.

10. The method of claim 1, wherein the determining if the first test should execute before the second test is performed based on a resource assignment order enforced by a tester operating system.

11. A computer-readable storage medium having stored thereon, computer executable instructions that, if executed by a computer system cause the computer system to perform a method for scheduling tests using automated test equipment (ATE), said method comprising:
   determining if any of a plurality of splits used by a first test contains at least one shared resource, wherein the first test is sequenced for execution in a first test flow branch and wherein a second test is sequenced for execution in a second test flow branch, wherein the first test flow branch is operable to execute concurrently with the second test flow branch;
   determining if the first test should execute before the second test if the split containing the at least one shared resource is associated with at least one resource required by both the first test and the second test; and
   responsive to a determination that the first test should execute before the second test, reserving the split containing the at least one shared resource for sole access by the first test and executing the first test.

12. The computer-readable medium as described in claim 11, wherein said method further comprises completing execution of the first test and releasing the split to other tests.

13. The computer-readable medium as described in claim 11, wherein said method further comprises, responsive to a determination that the second test should execute before the first test, pausing the first test to wait for the split while the second test has the split reserved.

14. The computer-readable medium as described in claim 11, wherein said method further comprises executing the second test simultaneously with the first test if it is determined that splits used by the first test contain no resources that are required by the second test.

15. The computer-readable medium as described in claim 11, wherein the shared resource is a Input/Output (I/O) pin.

16. The computer-readable medium as described in claim 15, wherein the I/O pin is selected from a group comprising: stimulus pin, measurements pin, and power supply pin.

17. A tester system comprising:
   a system controller for controlling a test plan and coupled to a bus; and
   tester hardware coupled to said bus and operable to test a plurality of devices under test,
   wherein the system controller communicates to the tester hardware through the bus and further wherein the system controller comprises a processor configured to:

determine if any of a plurality of splits used by a first test is associated with at least one shared resource, wherein the first test is sequenced for execution in a first test flow branch and wherein a second test is sequenced for execution in a second test flow branch, wherein the first test flow branch is operable to execute concurrently with the second test flow branch;

determine if the first test should execute before the second test if the split containing the at least one shared resource is associated with resources required by both the first test and the second test; and responsive to a determination that the first test should execute before the second test, reserve the split containing the at least one shared resource for sole access by the first test before beginning execution of the first test, wherein no other test is allowed access to the split while it is reserved.

18. The tester system of claim 17, wherein the processor is further configured to complete execution of the first test and release the split to other tests.

19. The tester system of claim 17, wherein the processor is further configured to, responsive to a determination that the second test should execute before the first test, pause the execution of the first test to wait for the split while the second test has the split reserved.

20. The tester system of claim 17, wherein the processor is further configured to execute the second test simultaneously with the first test if it is determined the splits used by the first test contain no resources that are required by the second test.

21. The tester system of claim 17, wherein the shared resource is an Input/Output (I/O) pin.

22. The tester system of claim 17, wherein the first test flow branch comprises tests related to a first core of a device under test (DUT) and wherein the second test flow branch comprises tests related to a second core of the DUT, wherein the first core of the DUT performs a function different from the second core of the DUT.

23. A tester system comprising:
a system controller for controlling a test plan and coupled to a bus; and
tester hardware coupled to said bus and operable to test a plurality of devices under test,
wherein the system controller communicates to the tester hardware through the bus and further wherein the system controller comprises a processor configured to:
execute a first test in a first test flow branch;
execute a second test in a second test flow branch, wherein the second test flow branch executes concurrently with the first test flow branch; and
allocate a resource so that the first test and the second test can share the resource, wherein the resource is solely allocated to one of the first test and the second test at any point in time;
wherein the first test flow branch comprises tests related to a first core of a device under test (DUT) and wherein the second test flow branch comprises tests related to a second core of the DUT, wherein the first core of the DUT performs a function different from the second core of the DUT.

\* \* \* \* \*